(12) United States Patent
Kell et al.

(10) Patent No.: US 8,268,645 B2
(45) Date of Patent: Sep. 18, 2012

(54) METHOD AND APPARATUS FOR FORMING A THIN LAMINA

(75) Inventors: Adam Kell, Orinda, CA (US); Robert Clark-Phelps, Northborough, MA (US); Joseph D. Gillespie, Boston, MA (US); Gopal Prabhu, San Jose, CA (US); Takao Sakase, Rowley, MA (US); Theodore H. Smick, Essex, MA (US); Steve Zuniga, Soquel, CA (US); Steve Bababyan, Los Altos, CA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 0 days.

(21) Appl. No.: 13/331,909

(22) Filed: Dec. 20, 2011

(65) Prior Publication Data

US 2012/0171809 A1 Jul. 5, 2012

Related U.S. Application Data

(63) Continuation-in-part of application No. 12/980,424, filed on Dec. 29, 2010, now Pat. No. 8,173,452.

(60) Provisional application No. 61/510,477, filed on Jul. 21, 2011, provisional application No. 61/510,476, filed on Jul. 21, 2011, provisional application No. 61/510,478, filed on Jul. 21, 2011, provisional application No. 61/510,475, filed on Jul. 21, 2011.

(51) Int. Cl.
*H01L 21/00* (2006.01)
*H02N 6/00* (2006.01)

(52) U.S. Cl. .......................................... 438/19; 136/243
(58) Field of Classification Search ................. 438/19; 136/243
See application file for complete search history.

(56) References Cited

U.S. PATENT DOCUMENTS

| | | | |
|---|---|---|---|
| 4,634,331 | A | 1/1987 | Hertel |
| 5,094,536 | A | 3/1992 | MacDonald et al. |
| 5,589,008 | A | 12/1996 | Keppner |
| 5,685,588 | A | 11/1997 | Wong et al. |
| 6,486,008 | B1 | 11/2002 | Lee |
| 6,651,866 | B2 | 11/2003 | Bendat et al. |
| 6,833,312 | B2 | 12/2004 | Yanagita et al. |
| 7,160,105 | B2 | 1/2007 | Edwards et al. |
| 7,336,015 | B2 | 2/2008 | Arlt et al. |
| 7,339,110 | B1 | 3/2008 | Mulligan et al. |
| 7,564,672 | B2 | 7/2009 | Retzlaff |
| 7,732,301 | B1 | 6/2010 | Pinnington et al. |
| 7,749,884 | B2 | 7/2010 | Mathew et al. |
| 7,863,157 | B2 | 1/2011 | Henley et al. |
| 7,985,604 | B2 | 7/2011 | Isaka et al. |
| 2002/0094260 | A1 | 7/2002 | Coomer et al. |

(Continued)

OTHER PUBLICATIONS

Notice of allowance dated Mar. 22, 2012 for U.S. Appl. No. 12/980,424.

(Continued)

*Primary Examiner* — William D Coleman
(74) *Attorney, Agent, or Firm* — The Mueller Law Office

(57) ABSTRACT

A method for producing a lamina from a donor body includes implanting the donor body with an ion dosage and heating the donor body to an implant temperature during implanting. The donor body is separably contacted with a susceptor assembly, where the donor body and the susceptor assembly are in direct contact. A lamina is exfoliated from the donor body by applying a thermal profile to the donor body. Implantation and exfoliation conditions may be adjusted in order to maximize the defect-free area of the lamina.

26 Claims, 10 Drawing Sheets

Embodiment of 12/026530

Embodiment of 12/026530

U.S. PATENT DOCUMENTS

| | | |
|---|---|---|
| 2004/0040593 A1 | 3/2004 | Ho et al. |
| 2008/0160661 A1 | 7/2008 | Henley |
| 2008/0179547 A1 | 7/2008 | Henley |
| 2009/0277314 A1 | 11/2009 | Henley |
| 2010/0178723 A1 | 7/2010 | Henley |
| 2010/0326510 A1 | 12/2010 | Agarwal et al. |
| 2012/0003775 A1 | 1/2012 | Agarwal et al. |

OTHER PUBLICATIONS

Office Action dated Feb. 29, 2012 for U.S. Appl. No. 12/980,424.

Office Action dated Nov. 10, 2011 for U.S. Appl. No. 12/980,424.

Pargfrieder et al., Temporary Bonding and DeBonding Enabling TSV Formation and 3D Integration for Ultra-thin Wafers, 2008 10th Electronics Packaging Technology Conference, IEEE, 2008.

Ravi, K.V., "Thin Single Crystal Silicon Solar Cells on Ceramic Substrates," PowerPoint presentation, U.S. Department of Energy, Solar Energy Technologies Program Peer Review, May 25, 2010.

Reboh et al., Localized exfoliation versus delamination in H and He coimplanted 001 Si, Journal of Applied Physics, May 12, 2009, vol. 105, 093528-1.

Solanki, C. S. et al., "Thin-film Free-standing Monocrystalline Si Solar Cells with Heterojunction Emitter," Prog. Photovolt: Res. Appl. 2005; 13:201-208.

Office Action dated Jul. 19, 2012 for U.S. Appl. No. 13/331,915.

Embodiment of 12/026530

Embodiment of 12/026530

Embodiment of 12/026530

Embodiment of 12/026530

METHOD AND APPARATUS FOR FORMING A THIN LAMINA

RELATED APPLICATIONS

This application is a continuation in part to Murali et al., U.S. patent application Ser. No. 12/980,424, "A Method to Form a Device by Constructing a Support Element on a Thin Semiconductor Lamina" filed on Dec. 29, 2010, owned by the assignee of the present application, and hereby incorporated by reference. Pursuant to 35 U.S.C. §119 (e), this application claims priority to the filing dates of: U.S. Provisional Patent Application Ser. No. 61/510,477, "Detection Methods in Exfoliation of Lamina," filed on Jul. 21, 2011; U.S. Provisional Patent Application Ser. No. 61/510,476, "Support Apparatus and Methods For Production of Silicon Lamina," filed on Jul. 21, 2011; U.S. Provisional Patent Application Ser. No. 61/510,478, "Ion Implantation and Exfoliation Methods," filed on Jul. 21, 2011; and U.S. Provisional Patent Application Ser. No. 61/510,475, "Apparatus and Methods for Production of Silicon Lamina," filed on Jul. 21, 2011; the disclosures of which applications are herein incorporated by reference. This application is also related to Kell et al., U.S. patent application Ser. No. 13/331,915, entitled "A Method and Apparatus for Forming a Thin Lamina" filed on Dec. 20, 2011, which is hereby incorporated by reference.

BACKGROUND OF THE INVENTION

A conventional prior art photovoltaic cell includes a p-n diode; an example is shown in FIG. 1. A depletion zone forms at the p-n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either a p+/n− junction (as shown in FIG. 1) or a n+/p− junction. The more lightly doped region is known as the base of the photovoltaic cell, while the more heavily doped region, of opposite conductivity type, is known as the emitter. Most carriers are generated within the base, and it is typically the thickest portion of the cell. The base and emitter together form the active region of the cell.

Ion implantation is a known method for forming a cleave plane in a semiconductor material to form lamina utilized in photovoltaic cells. The ion implantation and exfoliation steps in these methods may have a significant effect on the quality of the lamina produced. It is desirable to improve the methods and apparatus for producing lamina.

SUMMARY OF THE INVENTION

A method for producing a lamina from a donor body includes implanting the donor body with an ion dosage and heating the donor body to an implant temperature during implanting. The donor body is separably contacted with a susceptor assembly, where the donor body and the susceptor assembly are in direct contact. A lamina is exfoliated from the donor body by applying a thermal profile to the donor body. Implantation and exfoliation conditions may be adjusted in order to maximize the defect-free area of the lamina.

BRIEF DESCRIPTION OF THE DRAWINGS

Each of the aspects and embodiments of the invention described herein can be used alone or in combination with one another. The aspects and embodiments will now be described with reference to the attached drawings.

DETAILED DESCRIPTION OF THE EMBODIMENTS

Methods and apparatus are described in which a free standing lamina is formed and separated from a donor body without adhesive or permanent bonding to a support element. Methods and apparatus of this invention include implanting a first surface of a donor body with an ion dosage and heating the donor body to an implant temperature during implanting. The first surface of the donor body is separably contacted with a first surface of a susceptor assembly and a lamina is exfoliated from the donor body by applying a thermal profile to the donor body. The lamina may then be separated from the donor body. In some embodiments separation methods comprise applying a deforming force to a surface of the lamina or donor body. Implantation and exfoliation conditions may be adjusted according to the material of the donor body in order to maximize the defect free area of a thin free standing lamina.

Figure 1:
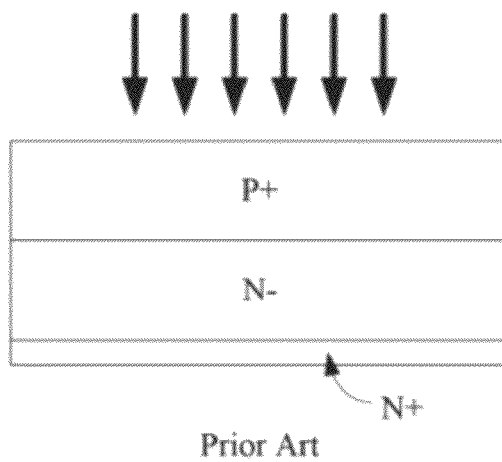
FIG. 1 is a cross-sectional view of a prior art photovoltaic cell.

Conventional photovoltaic cells formed from silicon bodies include p-n diodes in which a depletion zone forms at the p-n junction as shown in FIG. 1. The silicon donor body used to form photovoltaic cells is typically about 200 to 250 microns thick. Thinner laminas formed from silicon donor bodies may be used to form photovoltaic cells by permanent fixation of the lamina to support elements either via epitaxial growth, adhesive material or other methods that result in a bonded lamina prior to cleavage or separation from a donor body. Typically, lamina formed in this manner must either incorporate the support element into any resultant photovoltaic cell or engage in a debonding step to remove the support element. In the present invention methods and apparatus are described in which a thin, free standing lamina may be formed and separated from a donor body without adhesive or permanent bonding to a support element and without requiring debonding or cleaning steps prior to photovoltaic cell fabrication. In the present invention a donor body is implanted through a first surface to form a cleave plane. The first surface of a donor body may then be placed adjacent to a support element. A heating step is performed that exfoliates a lamina from the first surface donor body, creating a second surface. This process occurs in the absence of bonded support element on the lamina. The ion implantation and exfoliation conditions may have a significant effect on the quality of the lamina produced by this method and may be optimized to reduce the amount of physical defects that may be formed in the free standing lamina. Methods for the separation of the exfoliated thin free standing lamina are also described.

Figure 2A:
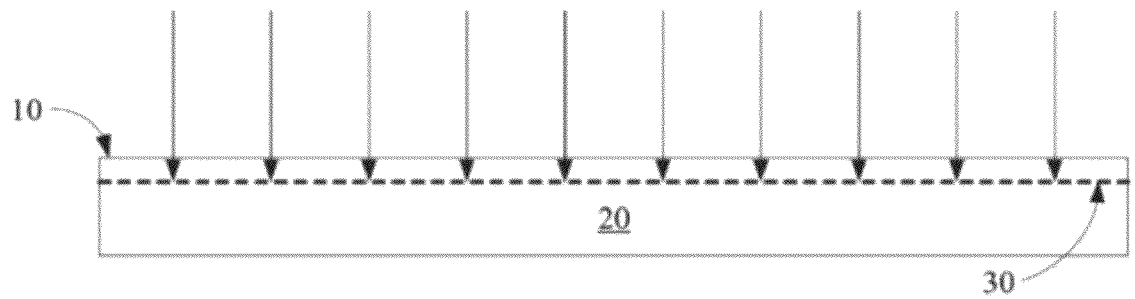
FIG. 2A through 2D are cross-sectional views showing stages in the formation of the photovoltaic device of Sivaram et al., U.S. patent application Ser. No. 12/026,530.
Figure 2B:
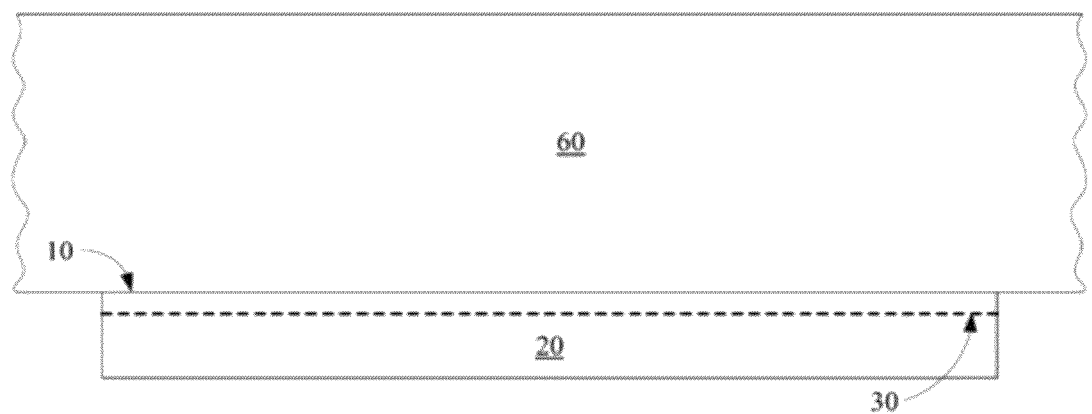
Figure 2C:
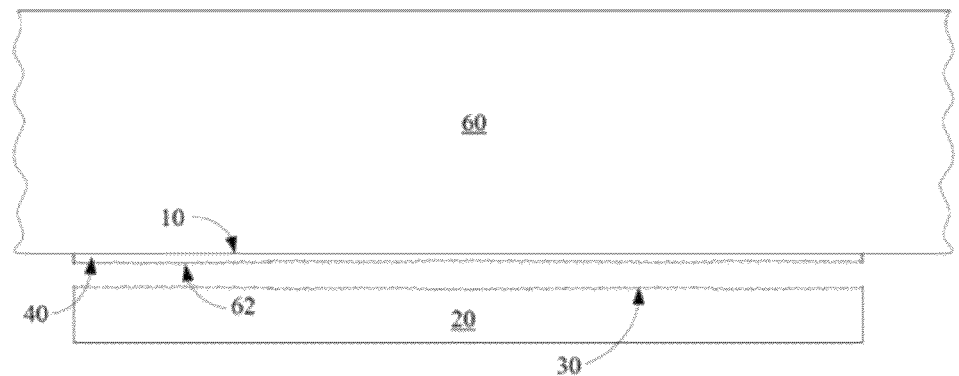
Figure 2D:
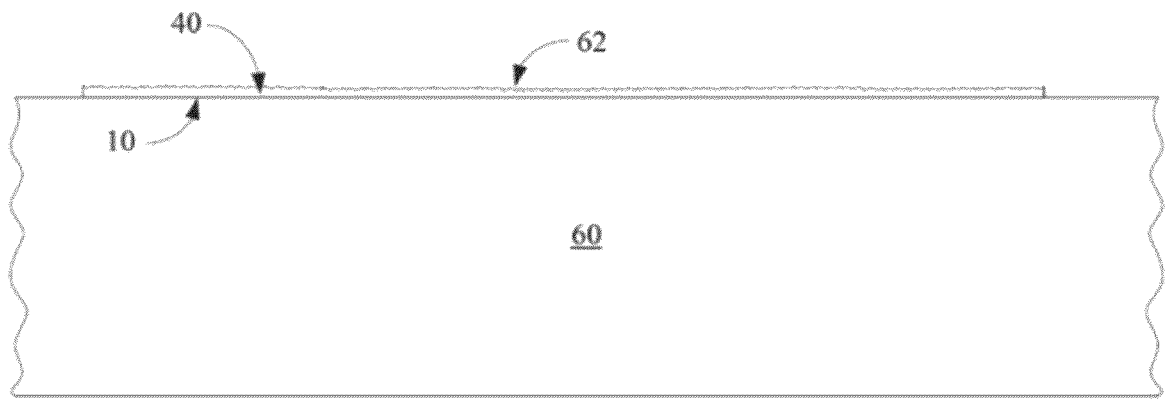

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes the fabrication of a photovoltaic cell comprising a thin semiconductor lamina formed of non-deposited semiconductor material. Referring to FIG. 2A, in embodiments of Sivaram et al., a semiconductor donor body 20 is implanted through first surface 10 with one or more species of gas ions, for example hydrogen and/or helium ions. The implanted ions define a cleave plane 30 within the semiconductor donor body. As shown in FIG. 2B, donor body 20 is affixed at first surface 10 to receiver 60. Referring to FIG. 2C, an anneal step causes lamina 40 to cleave from donor body 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick or between about 4 and about 20 or between about 5 and about 15 microns thick, though any thickness within the named range is possible. FIG. 2D shows the structure inverted, with receiver 60 at the bottom, as during operation in some embodiments. Receiver 60 may be a discrete receiver element having a maximum width no more than 50 percent greater than that of donor body 10, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference. Alternatively, a plurality of donor bodies may be affixed to a single, larger receiver, and a lamina cleaved from each donor body.

Using the methods of Sivaram et al., photovoltaic cells, rather than being formed from sliced wafers, are formed of thin semiconductor laminae without wasting silicon through kerf loss or by fabrication of an unnecessarily thick cell, thus reducing cost. The same donor wafer can be reused to form multiple laminae, further reducing cost, and may be resold after exfoliation of multiple laminae for some other use.

In the present invention, a free standing lamina is formed by implanting a semiconductor donor body with ions to define a cleave plane and exfoliating a semiconductor lamina from the donor body at the cleave plane. The lamina has a non-bonded first surface and a non-bonded second surface opposite the first. After the exfoliation step, the lamina is separated from the donor body and fabricated into a photovoltaic cell in which the lamina comprises a base region of the photovoltaic cell. The thickness of the lamina may be between about 4 microns and about 20 microns. One, two or more layers may be formed on the first surface of the lamina before incorporating the lamina into a photovoltaic cell. One, two or more layers may be formed on the second surface of the free standing lamina. The thickness of lamina is determined by the depth of cleave plane. In many embodiments, the thickness of lamina is between about 1 and about 10 microns, for example between about 2 and about 5 microns, for example about 4.5 microns. In other embodiments, the thickness of lamina is between about 4 and about 20 microns, for example between about 10 and about 15 microns, for example about 11 microns. The second surface is created by cleaving. While different flows are possible, in general, the thin lamina is provided without permanent or adhesive fixing to a support element. In most embodiments, it has been exfoliated and separated from a larger donor body, such as a wafer or boule.

Figure 3:
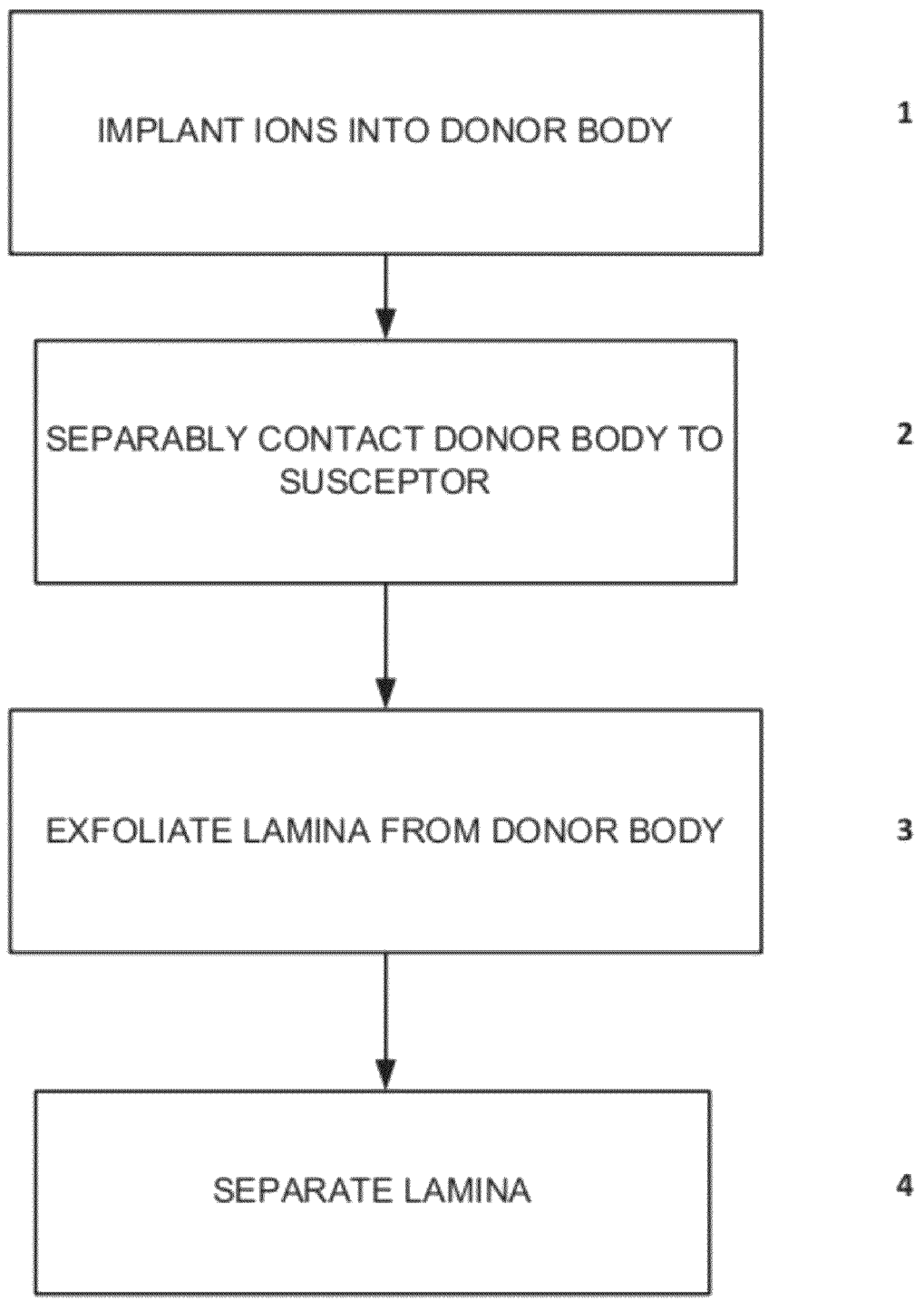
FIG. 3 is a flow chart showing steps of an exemplary method according to aspects of the present invention.

Turning to FIG. 3 in which the methods of present invention are outlined, a donor body is first implanted with ions through a first surface to form a cleave plane (Step 1, FIG. 3). Implant conditions may be adjusted to mitigate the appearance physical defects (e.g., tears, cracks, rips, wave-front defects, radial striations, flaking or any combination thereof) in the lamina ultimately formed. In one embodiment the physical defects comprise cracks, and methods of this invention provide for a free standing lamina wherein the total length of the cracks is less than 100 mm. Physical defects include any defects which may cause shunting or reduced performance in completed cells. The area of a lamina that comprises the physical defect may be equivalent to the area rendered unusable in a photovoltaic cell. Implant conditions that may be adjusted to maximize the area that is substantially free of defects in the cleaved lamina include the temperature and/or the pressure applied to the donor body during implantation. In some embodiments the implant temperature may be maintained between 25 and 300° C., such as between 100 and 200° C. or between 120 and 180° C. One aspect of the invention is that the implant temperature may be adjusted depending upon the material and orientation of the donor body. In some embodiments, the material is {111} oriented silicon and the implant temperature may be between 150 and 200° C. In other embodiments the material is {100} oriented silicon and the implant temperature may be between 25 and 150° C. The methods disclosed herein may apply to any other orientation of semiconductor donor bodies as well such as {110} oriented silicon, or {001}. The implant temperature may be optimized for any silicon orientation and implant energy. Other implantation conditions that may be adjusted may include initial process parameters such as implant dose and the ratio of implanted ions (e.g., H:He ratio). In some embodiments implant conditions may be optimized in combination with exfoliation conditions such as exfoliation temperature, exfoliation susceptor vacuum level, heating rate and/or exfoliation pressure in order to maximize the area that is substantially free of physical defects present in the lamina. In some embodiments, greater than 90% of the surface area of the lamina produced by methods of this invention is free from physical defects.

Following the implantation to form a cleave plane, the donor body may be contacted to a temporary support element (FIG. 3, Step 2) such as a susceptor assembly for further processing. Typically donor bodies, lamina or photovoltaic cells in various stages of manufacture may be affixed to temporary carriers with adhesive or via chemical bonding. When adhesive is used, additional steps are required to initiate the debonding of the lamina and/or to clean the surface of the photovoltaic cell and the temporary carrier after detachment. Alternatively, support elements may be dissolved or otherwise removed and rendered unusable for further support steps. In one aspect of this invention, the donor body is separably contacted, without adhesive or permanent bonding, with a support element such as a susceptor assembly in order to stabilize the lamina during exfoliation. The contact may be direct contact between the donor body and support element, and comprise no adherents or bonding steps that require a chemical or physical step to disrupt the contact beyond merely lifting the donor body or lamina from the susceptor. The susceptor may then be reused as a support element without further processing. In some embodiments of methods of this invention, the implanted donor body may be separably contacted with a support element such as a susceptor assembly wherein the interacting force between the donor body and the susceptor during exfoliation is solely the weight of the donor body on the susceptor or solely the weight of the susceptor assembly on the donor body. In the case in which contact is established solely by the weight of the donor body, the donor body may be oriented with the implanted side facing down and in contact with the susceptor. Alternatively, the donor body may be oriented with the implanted side facing up and not in contact with the susceptor. In this case, a cover plate may be used to stabilize the lamina during and after exfoliation. In other embodiments the contacting may further comprise a vacuum force between the susceptor and the donor body. A vacuum force may be applied to the donor body in order to temporarily fix the donor body to a susceptor assembly without the use of adhesives, chemical reactions, electrostatic pressure or the like.

Contacting the lamina to a non-bonded support element during the steps of exfoliation and damage anneal, as in the present invention, provides several significant advantages. The steps of exfoliation and anneal take place at relatively high temperature. If a pre-formed support element is affixed, such as with adhesives or chemicals, to the donor body before these high-temperature steps, it will necessarily be exposed to high temperature along with the lamina, as will any intervening layers. Many materials cannot readily tolerate high temperature, and if the coefficients of thermal expansion (CTEs) of the support element and the lamina are mismatched, heating and cooling will cause strain which may damage the thin lamina. Thus, a non-bonded support element provides for an optimized surface for lamina manufacture independent of bonding and debonding protocols that would potentially inhibit the formation of a defect free lamina. Annealing may occur before or after the lamina is separated from the donor body.

Following the contacting of the donor body to the susceptor assembly, heat may be applied to the donor body to cleave a lamina from the donor body at the cleave plane. Exfoliation conditions may be optimized to cleave the lamina from the donor body (FIG. 3, Step 3) in order to minimize physical defects in a lamina exfoliated in the absence of an adhered support element. Exfoliation parameters may be optimized with respect to particular donor bodies. Exfoliation may occur at ambient pressure. An exfoliation thermal profile may be applied that has one, or two, or more thermal ramps. In some embodiments the exfoliation conditions may comprise single rapid thermal ramp to a peak exfoliation temperature that is greater than 600° C. The thermal ramp rate may be 100° C./minute, 200° C./minute or greater. The material of the susceptor may have a lower heat capacity than that of the donor body and be resistant to thermal degradation at the final exfoliation temperature in order to facilitate exfoliation by this method. In other embodiments, the final exfoliation temperature may be between 400 and 600° C. in which the ramp rate is any speed, but the temperature is applied substantially uniformly across the surface area of the lamina. The susceptor assembly may comprise a thermally anisotropic material in order to facilitate a uniform thermal profile across the surface of the donor body during exfoliation. In some embodiments, the donor body may be transported into an area of higher temperature such that the heating of the donor body progresses from one end of the body to the other in a uniform manner. In one embodiment the donor body is moved from a lower temperature zone to a higher temperature zone (e.g., a belt furnace). The rate of movement may provide for rapid changes in the temperature of the donor such as 60° C./minute, 200° C./minute or greater.

The exfoliated lamina may be separated from the donor body by any means (FIG. 3, Step 4) such as by applying a deforming force to a first surface of the donor body away from an opposite surface of the newly formed lamina. In some embodiments, the donor body may be deformed away from the exfoliated lamina. In other embodiments, the exfoliated lamina may be deformed away from the donor body. After exfoliation, the surface of the free standing lamina that was the first surface of the donor body may be separably contacted with a supporting device such as a susceptor assembly. In some embodiments the contacting force may comprise a vacuum force between the lamina and a susceptor plate. In some embodiments the contacting force may be merely the weight of the donor body on the lamina. A chuck plate may be adhered to the donor body on a surface opposite the lamina. In some embodiments the adherence may be a vacuum force applied through a porous chuck plate to the donor body. Vacuum pressure may be applied through the chuck plate, thus adhering the donor body to the chuck plate. The chuck plate may be coupled to a flexing device such as a flexing arm, or a deformable plate, or the like. A force applied to the flexing device may deform the donor body away from the lamina. The force may deform any portion of the donor body, such as an edge or other region, away from the lamina. The deformation may separate the donor body to a distance of greater than 1 mm away from a portion of the lamina surface, freeing an edge of the donor body for subsequent full separation of the lamina from the donor body. The separated lamina may remain on the susceptor plate or be transferred to a different temporary or permanent support element for further processing. In some embodiments a permanent support may be constructed on the free standing lamina.

An aspect of this invention comprises the process of fabricating a photovoltaic cell from a free standing lamina and begins with a donor body of an appropriate semiconductor material. An appropriate donor body may be a monocrystalline silicon wafer of any practical thickness, for example from about 200 to about 1000 microns thick. Typically the wafer has Miller indices of {100} or {111}, although other orientations may be used. In alternative embodiments, the donor wafer may be thicker; maximum thickness is limited only by practicalities of wafer handling. Alternatively, polycrystalline or multicrystalline silicon may be used, as may microcrystalline silicon, or wafers or ingots of other semiconductor materials, including germanium, silicon germanium, or III-V or II-VI semiconductor compounds such as GaAs, InP, etc. Other material may be used, such as SiC, $LiNbO_3$, $SrTiO_3$, sapphire, and the like. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline. It will be appreciated by those skilled in the art that the term "monocrystalline silicon" as it is customarily used will not exclude silicon with occasional flaws or impurities such as conductivity-enhancing dopants.

The process of forming monocrystalline silicon generally results in circular wafers, but the donor body may have other shapes as well. For photovoltaic applications, cylindrical monocrystalline ingots are often machined to an octagonal cross section prior to cutting wafers. Wafers may also be other shapes, such as square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this disclosure will describe the use of a monocrystalline silicon wafer as the semiconductor donor body, but it will be understood that donor bodies of other types and materials can be used.

Ions, preferably hydrogen or a combination of hydrogen and helium, are implanted into body through a first surface to define a cleave plane, as described earlier. The overall depth of the cleave plane is determined by several factors, including implant energy. The depth of the cleave plane can be between about 0.2 and about 100 microns from the first surface, for example between about 0.5 and about 20 or about 50 microns, for example between about 1 and about 10 microns, between about 1 or 2 microns and about 5 or 6 microns, or between about 4 and about 8 microns. Alternatively, the depth of the cleave plane can be between about 5 and about 15 microns, for example about 11 or 12 microns.

Temperature and dosage of ion implantation may be adjusted according to the material to be implanted and the desired depth of the cleave plane, in order to provide a free standing lamina that is substantially free of physical defects. The ion dosage may be any dosage such as between $1.0 \times 10^{14}$ and $1.0 \times 10^{18}$ H/cm$^2$. The implant temperature may be any temperature such as greater than 140° C. (e.g., between 150 and 250° C.). The implant conditions may be adjusted based on the Miller indices of the donor body and the energy of the implanted ions. For example, monocrystalline silicon with Miller indices of {111} may require a different set of implantation conditions than mono-crystalline silicon donor wafers with Miller indices of {100}. One aspect of the present invention comprises adjusting implantation conditions to maximize the area that is substantially defect-free in a lamina. In some embodiments the implant dose may be less than $1.3 \times 10^{17}$ H/cm$^2$ in combination with an implant temperature that is greater than 25° C., such as between 80° C. and 250° C. In some embodiments a monocrystalline silicon donor body with Miller indices of {111} may be implanted at a temperature between 150 and 200° C. In some embodiments a monocrystalline silicon donor body with Miller indices of {100} may be implanted at a temperature between 100 and 150° C. In some embodiments higher implant temperatures may result in more uniform exfoliation.

Figure 4A:
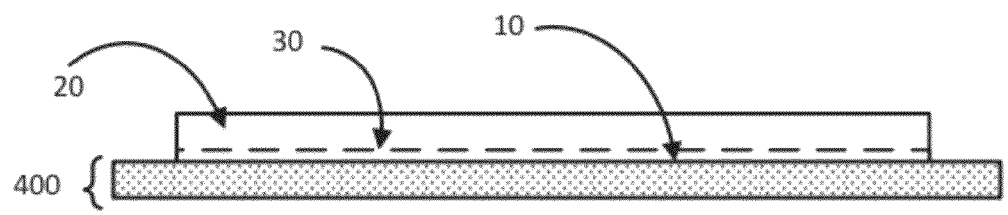
FIGS. 4A and 4B are cross sectional views showing stages of lamina formation according to embodiments of the present invention.
Figure 4:
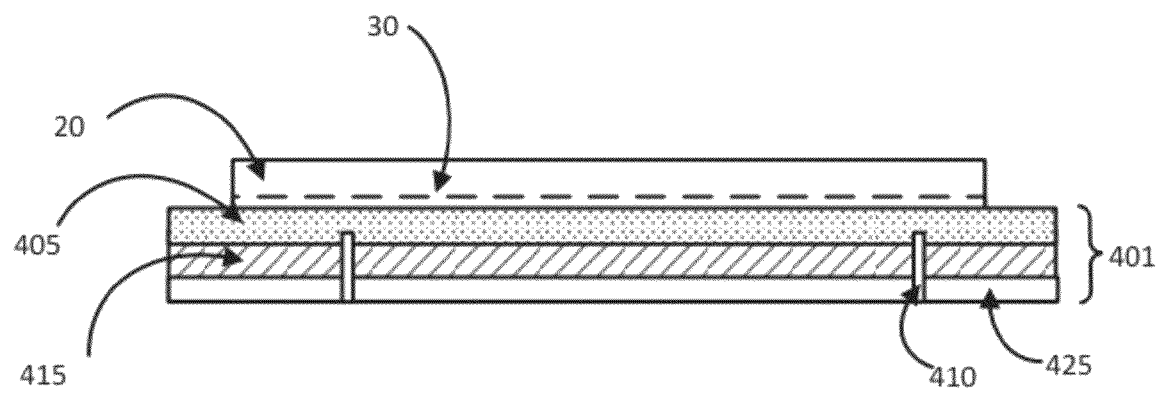

Referring to FIG. 4A, the implanted surface 10 of the donor body 20 may be separably contacted with a support element such as a susceptor assembly 400. The susceptor assembly may be in contact with the donor body while remaining unbonded to the donor body. The force of the contact between the donor body and the susceptor assembly during exfoliation may be solely the weight of the donor body. Alternatively the entire assembly and donor body may be inverted and the contacting force may be the weight of the susceptor assembly on the donor body. In some embodiments the contacting force between the donor body and the susceptor may be augmented by a vacuum force between the susceptor and the donor body. The material properties of the susceptor assembly may facilitate the exfoliation of a substantially defect-free lamina from the donor body. The susceptor assembly 400 may comprise a single susceptor plate that is flat as in FIG. 4A. In some embodiments the surface of the susceptor assembly may comprise a material having substantially the same coefficient of thermal expansion (CTE) as the donor body over a wide range of temperatures (e.g., 0 to 1000° C.). The susceptor assembly may comprise a material having a heat capacity that is substantially the same or lower than the heat capacity of the donor body in order to support a rapid thermal ramp to an exfoliation temperature greater than 400° C.

In other embodiments as shown in FIG. 4B, the susceptor assembly 401 may comprise multiple plates to provide appropriate conditions for the processing of a lamina from a donor body 20. In some embodiments the contacting force between the susceptor assembly 401 and the donor body may be a vacuum force applied through vacuum channels 410 to a porous susceptor plate 405 of the susceptor assembly (as depicted in FIG. 4B). When a vacuum force is utilized to hold the donor body, the susceptor plate 405 may be porous graphite or any material permeable to a vacuum pressure. For example, the material of the porous plate 405 may comprise porous graphite, porous boron nitride, porous silicon, porous silicon carbide, laser-drilled silicon, laser-drilled silicon carbide, aluminum oxide, aluminum nitride, silicon nitride or any combination thereof. Vacuum pressures in the range of about 0 to about −100 psi, (e.g., between 0 psi and −15 psi) may be applied. The susceptor assembly 401 may comprise a first plate 405 that has a coefficient of thermal expansion (CTE) similar or substantially the same as the coefficient of thermal expansion of the donor body 20. In some embodiments the thermal profile applied during exfoliation must be substantially uniform across the surface of the donor body to facilitate the successful exfoliation of a free standing lamina. In order to achieve a uniform thermal profile across the surface of the donor body, the susceptor assembly may comprise a second plate 415 adjacent to the first plate 405, with a thermal conductivity of the second plate 415 that is preferentially higher in a plane parallel to the donor body compared to in a direction normal to the donor body. A thermally anisotropic material such as pyrolytic graphite is well suited to facilitate the application of a substantially uniform thermal profile on the donor body in this manner. The susceptor assembly may optionally comprise a thermally insulative plate 425, such as a quartz plate disposed below the thermally anisotropic plate 415 in order to facilitate the maintenance of the thermal profile needed for exfoliation by thermally isolating the donor body from potentially cooling forces such as an operating vacuum manifold.

Following contact of the donor body to a susceptor assembly, a thermal exfoliation protocol may be applied that results in a free standing lamina that is substantially free of physical defects that is cleaved from the donor body 20 at the cleave plane 30. The exfoliation protocol may comprise one or two or more thermal ramps to one or two or more peak exfoliation temperatures, followed by thermal soaks for periods of time such as less than 1, 2, 3, 4, 5 or 6 minutes. Peak exfoliation temperatures may be between 350 and 900° C., such as between 350 and 500° C. or between 500 and 900° C. Ramp rates during thermal exfoliation profiles may also be optimized. Thermal ramp rates may range from, for example, 0.1° C./second to 20° C./second. Exfoliation pressures may be ambient pressure, or higher. The thermal exfoliation profile may be optimized according the material and orientation of the donor body in order to form a free standing lamina that is substantially free of physical defects.

In some embodiments a monocrystalline silicon lamina may be exfoliated from a donor body oriented at {111} by applying an exfoliation thermal profile comprising a single thermal ramp rate that is faster than 15° C./second to a final exfoliation temperature that is greater than 600° C. The peak exfoliation temperature may be held for 100, 50, 25 seconds or less. In other embodiments the thermal profile may comprise a ramp rate of between 0.1 and 5° C./second to a peak exfoliation temperature of between 400 and 600° C. in which the thermal ramp rate is substantially the same across the surface area of the lamina. The peak exfoliation temperature may be held for less than 3 minutes, 1 minute, or less than 30 seconds. The susceptor may comprise a thermally anisotropic material, such as second plate 415 of FIG. 4B, in order to facilitate the application of a uniform thermal profile across the surface of the donor body during exfoliation.

Alternatively, exfoliation may comprise two or more thermal ramps to provide for a more controlled exfoliation process. Multiple thermal ramps may accommodate donor bodies with Miller indices of {111}, {100} or other orientations. For example, the thermal profile may include a first thermal ramp rate that is between 10 and 20° C./second to a peak temperature between 350 and 500° C., followed by a second thermal ramp rate that is between about 5 and 20° C./second to peak temperature that is between 600 and 800° C. The peak exfoliation temperatures after each thermal ramp may be held for less than 60 seconds, followed by a cool down or further processing to anneal or separate the exfoliated lamina. In some embodiments the exfoliation protocol may comprise two or more thermal ramps under thermally anisotropic conditions to provide for a more controlled exfoliation process. Other examples of multiple thermal ramp rates include a first thermal ramp between 0.5 and 10° C./second to a peak temperature that is between 350 and 450° C. followed by a second thermal ramp between about 0.1 and 5° C./second to peak temperature that is between 450 and 700° C. The peak exfoliation temperatures after each thermal ramp may be held for less than 10 seconds followed by a cool down or further processing to anneal the exfoliated lamina. Thermal profiles may be applied by moving the susceptor assembly/cleaved donor body from a first zone of one temperature into a second zone of a different temperature. The first temperature may be lower than the second temperature. This process may be achieved via a belt furnace or other conveying device.

It has been found that the step of implanting to define the cleave plane may cause damage to the crystalline lattice of the monocrystalline donor wafer. This damage, if unrepaired, may impair cell efficiency. In the present disclosure, annealing may remove residual physical defects in the exfoliated lamina. A relatively high-temperature anneal, for example at greater than 800, 850, 900, or 950° C., will repair most implant damage in the body of the lamina. After exfoliation, the free standing lamina may be contacted to a susceptor, with the donor body remaining on top. The donor body may be deformed away from the exfoliated lamina by applying a deforming force to the surface of the donor body opposite the lamina. This method may apply a sufficiently gentle force in order to separate the donor from a lamina that is less than 50 μm thick without damaging the lamina. A vacuum chuck apparatus is then placed on top of donor body for contact with a surface of the donor body opposite the lamina. The first chuck plate of the vacuum chuck apparatus may cover the entire surface opposite the lamina as in FIG. 5 (chuck plate 515) or a portion of the surface opposite the lamina as in FIG. 6 (chuck plate 615). The first chuck plate may be a porous plate (e.g., porous graphite, porous boron nitride, porous silicon, porous silicon carbide, laser-drilled silicon, laser-drilled silicon carbide, aluminum oxide, aluminum nitride, silicon nitride or any combination thereof) or comprise a vacuum channel. A vacuum is applied through the first chuck plate, vacuum chucking the donor body. Next, the first chuck plate is deflected. A pressure may be applied to the backside of the flexing device, which causes a slight deflection of the flexing device, contacting plate and vacuum chucked donor body. An aspect of these vacuum chuck methods is that the edge of the donor body pulls away from the lamina first, allowing air to rush in between the donor and lamina surfaces. This action eliminates suction over the newly formed surface of the lamina that may result in the appearance of physical defects.

Figure 5A:
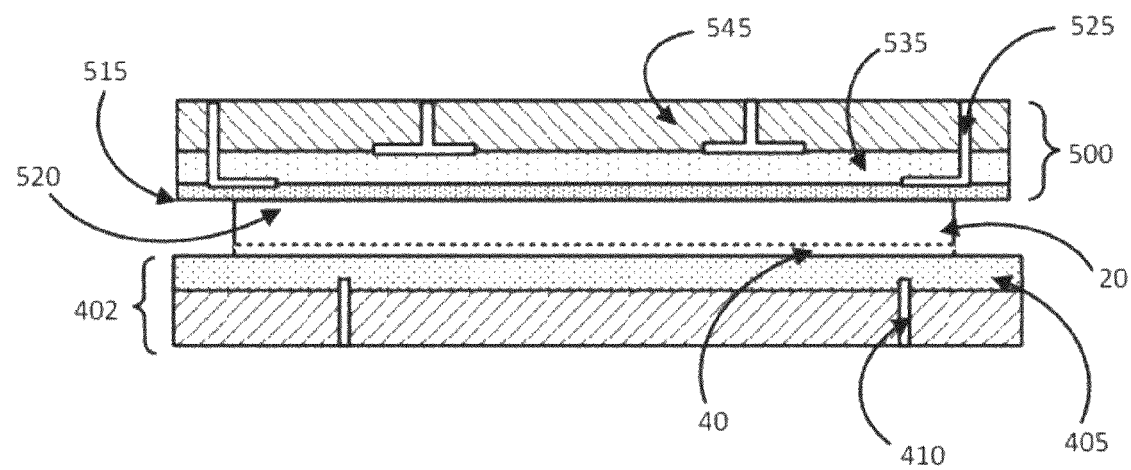
FIGS. 5A and 5B are cross sectional views showing lamina separation according to embodiments of the present invention.
Figure 5B:
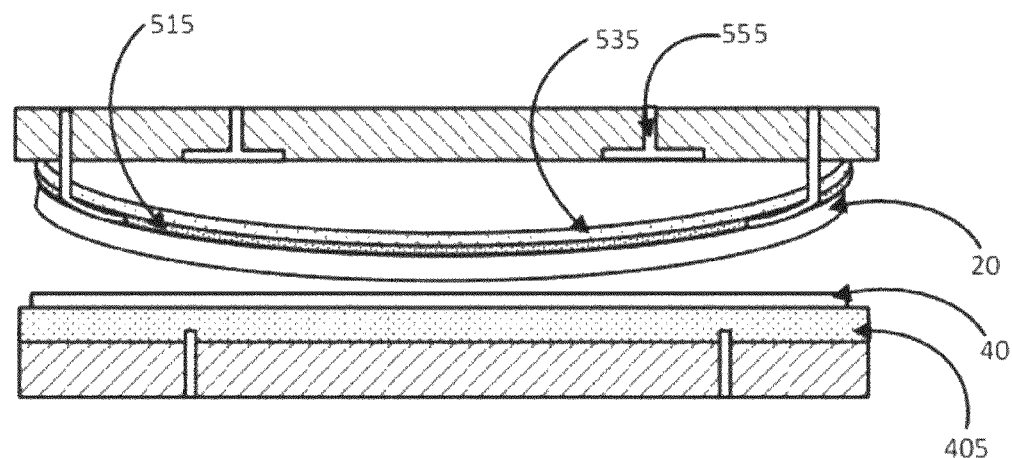

Referring now to FIGS. 5A and 5B, in some embodiments the separation of the lamina from the donor body may occur by the deformation of the donor body away from the lamina using a flexing plate. The deformation may facilitate the separation of the donor body from the free standing lamina in a manner that minimizes defects forming in the free standing lamina. FIG. 5A depicts a first step in an embodiment of this method wherein the donor body 20 is coupled to a separation chuck 500 such as a vacuum chuck. The chuck 500 may comprise a first chuck plate 515 that may hold to the surface 520 of donor body 20 opposite the lamina 40 via a vacuum pressure applied through vacuum channels 525 or any other adherent force. The first chuck plate 515 may be coupled to a flexing device such as a compliant arm, flexing arm, flexible plate 535 or the like. The flexing device may be coupled to a backing plate 545 or support arm, pivot point or the like. The exfoliated lamina 40 may be separably contacted to a susceptor plate 405 in a susceptor assembly 402. Additional contacting force may be applied to the susceptor plate 405 via vacuum pressure applied via vacuum channels 410. Separation is achieved by applying a force to the flexing device that flexes the surface of the donor body opposite the lamina. An embodiment of this separation is depicted in FIG. 5B showing the flexure of the flexible plate 535 and resultant deformation of the donor body 20 away from the lamina 40. In this embodiment, a positive pressure is applied to the backside of the flexible plate 535 via channels 555 which causes slight deflection of the flexible plate 535, the first chuck plate 515 and the chucked donor body 20. The positive pressure may be applied by any means such as a gas flow between the flexible plate 535 and the backing plate 545. A portion of the donor body 20 may be deformed between 1 and 3 mm or more from the lamina to initiate the separation of the donor body away from the cleaved lamina 40 which remains stationary on the susceptor plate 405. In an alternative embodiment, the donor body may remain fixed to a susceptor plate, while the cleaved lamina is attached to the chuck plate and separated from the donor body as described above.

Figure 6A:
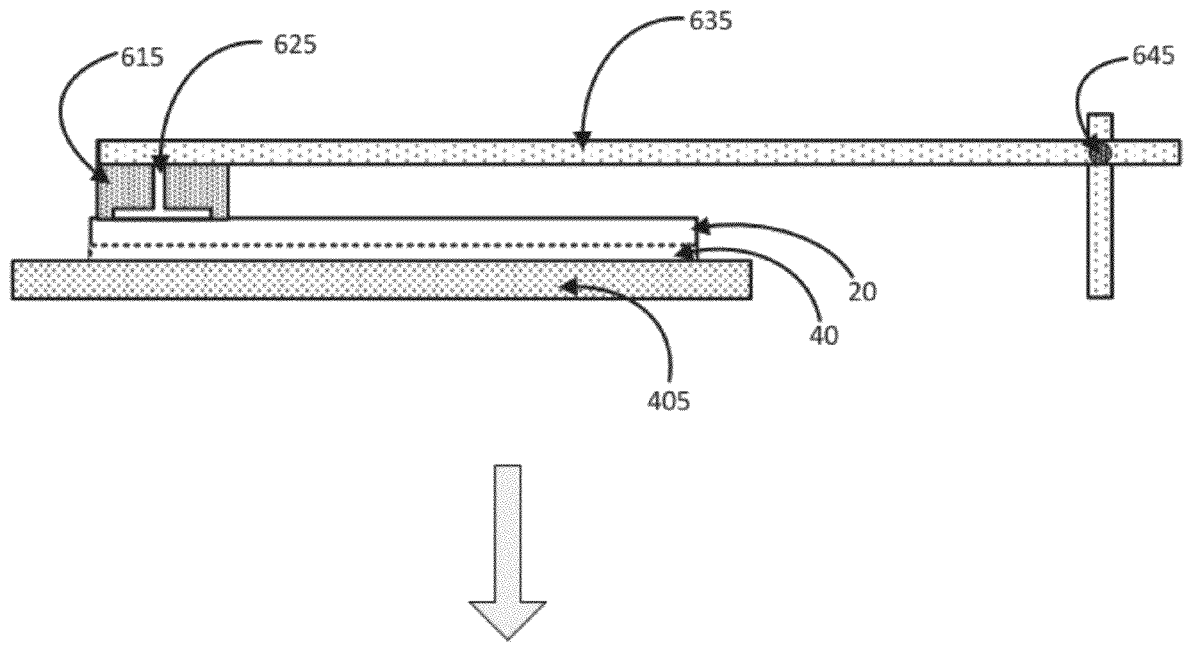
FIGS. 6A and 6B are cross sectional views showing lamina separation according to embodiments of the present invention.
Figure 6B:
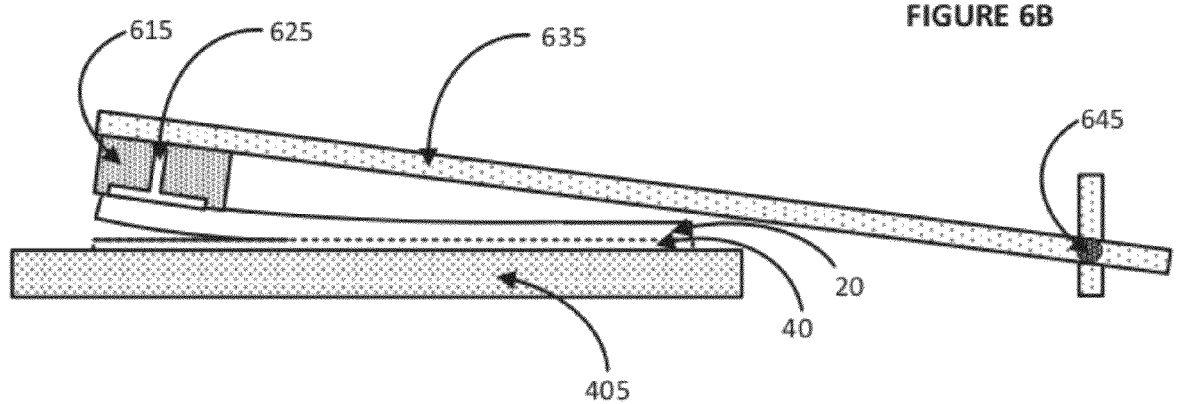

FIGS. 6A and 6B depict an embodiment of the separation process wherein the separation chuck comprises a first chuck plate 615 that adheres to only a portion of the surface of the donor body 20 opposite the lamina 40 and is coupled to a flexing device that is a rigid arm 635. The adherence between first chuck plate 615 and donor body 20 may utilize a vacuum force delivered through a vacuum channel 625. The first chuck plate 615 may be porous. The rigid arm 635 may be coupled to a pivot point 645 or any device designed to move the rigid arm away from the donor body. The lamina 40 may be fixed to, or merely contacting, the susceptor plate 405. Flexing the rigid arm 635 away from the lamina 40 as shown in FIG. 6B results in the deformation of a portion of donor body 20 away from the lamina 40 which remains stationary on the susceptor plate 405. In an alternative embodiment, the donor body may remain fixed to a susceptor plate, while the cleaved lamina is attached to the chuck plate 615 and separated from the donor body as described above. An anneal step may be performed at any stage in the process, such as after the separation of the free standing lamina, in order to repair damage caused to the crystal lattice throughout the body of lamina during the implant, exfoliation steps or separation steps. Annealing may be performed while the lamina remains in place on the susceptor assembly, for example, at temperatures greater than 500° C., for example at 550, 600, 650, 700, 800, 850° C. or greater, such as about 950° C. or greater for any amount of time. The structure may be annealed, for example, at about 650° C. for about 45 minutes or at about 800° C. for about ten minutes, or at about 950° C. for 120 seconds or less. In many embodiments the temperature exceeds 850° C. for at least 60 seconds. In some embodiments, it may be advantageous to remove the donor body before annealing the lamina to temperatures above 700° C. so that the structure and electronic properties of the donor are preserved for subsequent iteration of the implant-exfoliation process.

Figure 7A:
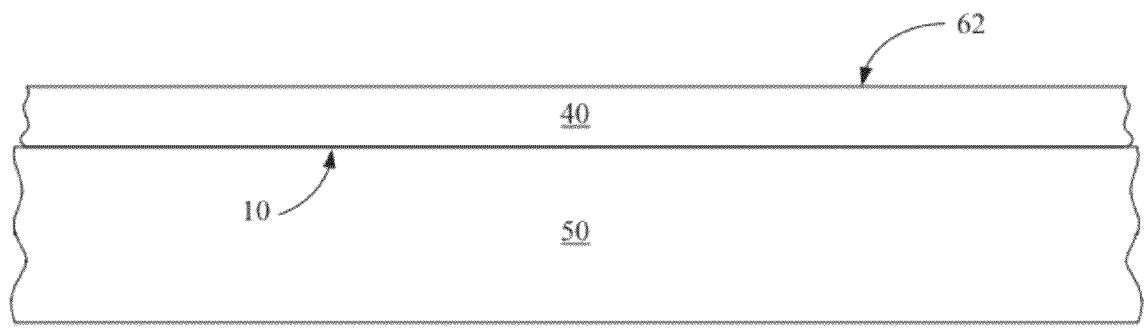
FIG. 7A through 7C show cross sectional views of stages in the formation of a photovoltaic device having a constructed metal support element.

A photovoltaic device may be fabricated from the free standing thin lamina after the lamina has been annealed. The lamina may be transferred to a temporary or permanent support for further processing to this end as described in U.S. patent application Ser. No. 12/980,424, "A Method to Form a Device by Constructing a Support Element on a Thin Semiconductor Lamina" filed on Dec. 29, 2010, and hereby incorporated by reference. This may be done, for example, using a vacuum paddle (not shown). To affect this transfer, a vacuum paddle may be placed on a second surface, while a vacuum on a first surface is released. Following transfer to the vacuum paddle, the second surface is held by vacuum, while first surface is exposed. Referring to FIG. 7A, the lamina 40 may be affixed to a temporary carrier 50, for example using an adhesive. This adhesive must tolerate moderate temperatures (up to about 200° C.) and must be readily releasable. Suitable adhesives include, for example, polyester with maleic anhydride and rosin, which is hydrocarbon-soluble; or polyisobutylene and rosin, which is detergent soluble. Temporary carrier 50 may be any suitable material, for example glass, metal, polymer, silicon, etc. Following transfer, first surface 10 will be held to temporary carrier 50 by adhesive, while second surface 62 is exposed.

Figure 7B:
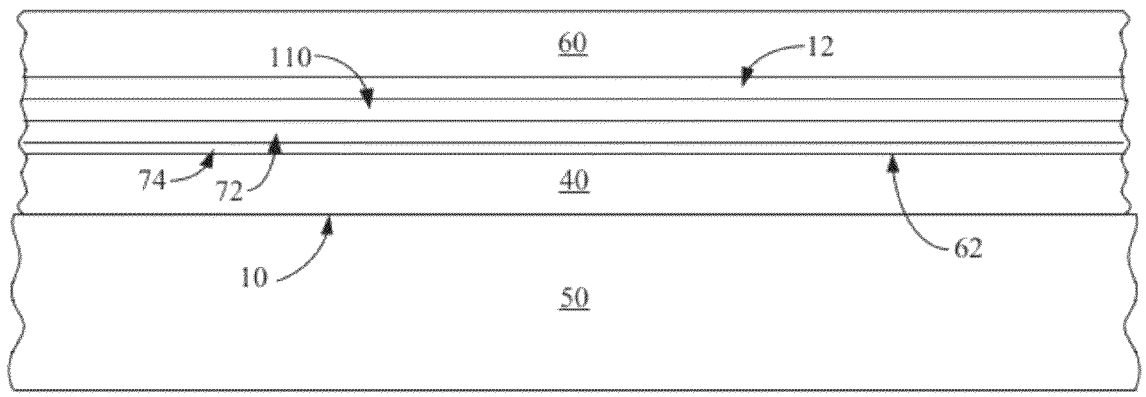

As depicted in FIG. 7B, further processing to form a photovoltaic device may follow. An etch step to remove damage caused by exfoliation may be performed, for example by applying a mix of hydrofluoric (HF) acid and nitric acid, or using KOH. It may be found that annealing is sufficient to remove all or nearly all damage and this etch step is unnecessary. The surface may be cleaned of organic materials and residual oxide, using a dilute HF solution; for example, 10:1 HF for two minutes. Following this wet process, an amorphous silicon layer 72 is deposited on second surface 62. This layer 72 may be heavily doped silicon and may have a thickness, for example, between about 50 and about 350 angstroms. FIG. 7B shows an embodiment that includes an intrinsic or nearly intrinsic amorphous silicon layer 74 between second surface 62 and doped layer 72, and in immediate contact with both. In other embodiments, layer 74 may be omitted. In this example, heavily doped silicon layer 72 is heavily doped n-type, the same conductivity type as lightly doped n-type lamina 40. Lightly doped n-type lamina 40 comprises the base region of the photovoltaic cell to be formed, and heavily doped amorphous silicon layer 72 provides electrical contact to the base region. If included, layer 74 is sufficiently thin that it does not impede electrical connection between lamina 40 and heavily doped silicon layer 72.

A transparent conductive oxide (TCO) layer 110 is formed on and in immediate contact with amorphous silicon layer 74. Appropriate materials for TCO 110 include indium tin oxide and aluminum-doped zinc oxide. This layer may be, for example, about between about 500 to about 1500 angstroms thick, for example about 750 angstroms thick. This thickness will enhance reflection from a reflective layer to be deposited. In some embodiments this layer may be substantially thinner, for example about 100 to about 200 angstroms. Amorphous silicon layer 76 may be applied to the second surface after the annealing of the lamina as well.

Figure 7C:
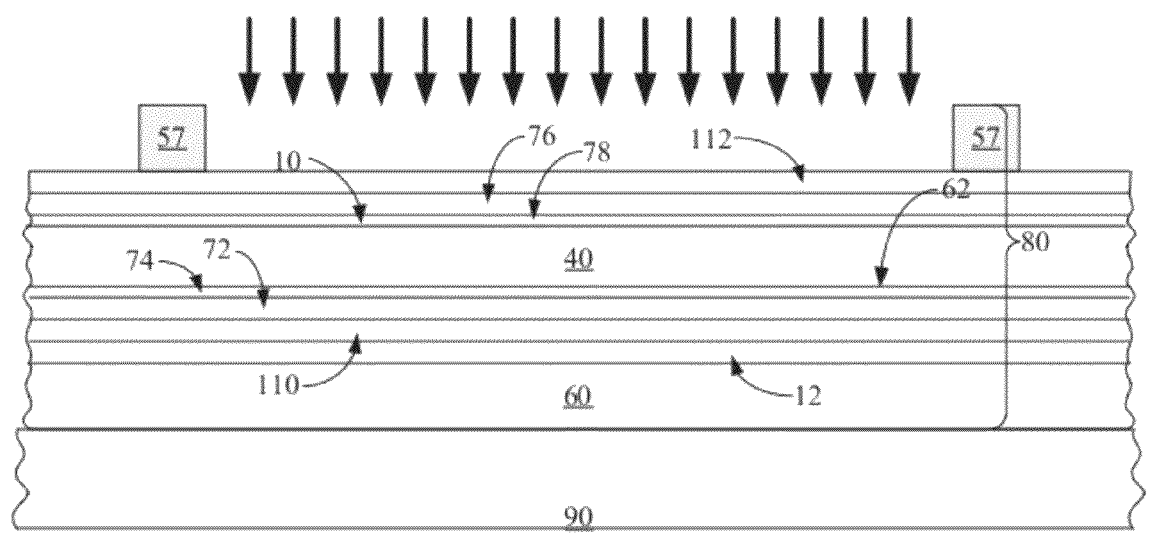

As will be seen in the completed device shown in FIG. 7C, incident light will enter lamina 40 at first surface 10. After passing through lamina 40, light that has not been absorbed will exit lamina 40 at second surface 62, then pass through TCO layer 110. A reflective layer 12 formed on TCO layer 110 will reflect this light back into the cell for a second opportunity to be absorbed, improving efficiency. A conductive, reflective metal may be used for reflective layer 12. Various layers or stacks may be used. In one embodiment, reflective layer 12 is formed by depositing a very thin layer of chromium, for example about 30 or 50 angstroms to about 100 angstroms, on TCO layer 110, followed by about 1,000 to about 3,000 angstroms of silver. In an alternative embodiment, not pictured, reflective layer 12 may be aluminum, having a thickness of about 1000 to about 3000 angstroms. In the next step, a layer will be formed by plating. Conventional plating cannot be performed onto an aluminum layer, so if aluminum is used for reflective layer 12, an additional layer or layers must be added to provide a seed layer for plating. In one embodiment, for example, a layer of titanium, for example between about 200 and about 300 angstroms thick, followed by a seed layer, for example of cobalt, which may have any suitable thickness, for example about 500 angstroms.

Metal support element 60 is formed on reflective layer 12 (a chromium/silver stack in this embodiment). In some embodiments the metal support element 60 is formed by electroplating. Temporary carrier 50 and lamina 40, and associated layers, are immersed in an electrolyte bath. An electrode is attached to reflective layer 12, and a current passed through the electrolyte. Ions from the electrolyte bath build up on reflective layer 12, to form a continuous metal support element 60. Metal support element 60 may be, for example, an alloy of nickel and iron. Iron is cheaper, while the coefficient of thermal expansion of nickel is better matched to that of silicon, reducing stress during later steps. The thickness of metal support element 60 may be as desired. Metal support element 60 should be thick enough to provide structural support for the photovoltaic cell to be formed. A thicker support element 60 is less prone to bowing. In contrast, minimizing thickness reduces cost. One skilled in the art will select a suitable thickness and iron:nickel ratio to balance these concerns. The thickness of metal support element 60 may be, for example, between about 25 and about 100 microns, for example about 50 microns. In some embodiments, the iron-nickel alloy is between about 55 and about 65 percent iron, for example 60 percent iron.

Lightly doped n-type lamina 40 comprises the base of the photovoltaic cell, and heavily doped p-type amorphous silicon layer 76 serves as the emitter of the cell. Heavily doped n-type amorphous silicon layer 72 will provide good electrical contact to the base region of the cell. Electrical contact must be made to both faces of the cell. Contact to the amorphous silicon layer 76 is made by gridlines 57, by way of TCO layer 112. Metal support element 60 is conductive and is in electrical contact with base contact 72 by way of conductive layer 12 and TCO layer 110.

FIG. 7C shows completed photovoltaic assembly 80, which includes a photovoltaic cell and metal support element 60. In alternative embodiments, by changing the dopants used, heavily doped amorphous silicon layer 72 may serve as the emitter, while heavily doped amorphous silicon layer 76 serves as a contact to the base region. Amorphous silicon layers 72 and 76 may be in immediate contact with the first and second surfaces of the free standing lamina respectively. Incident light (indicated by arrows) falls on TCO 112, enters the cell at heavily doped p-type amorphous silicon layer 76, enters lamina 40 at first surface 10, and travels through lamina 40. Reflective layer 12 will serve to reflect some light back into the cell. In this embodiment, receiver element 60 serves as a substrate. Receiver element 60 and lamina 40, and associated layers, form a photovoltaic assembly 80. Multiple photovoltaic assemblies 80 can be formed and affixed to a supporting substrate 90 or, alternatively, a supporting superstrate (not shown). Each photovoltaic assembly 80 includes a photovoltaic cell. The photovoltaic cells of a module are generally electrically connected in series.

Susceptor Apparatus

Figure 8A:
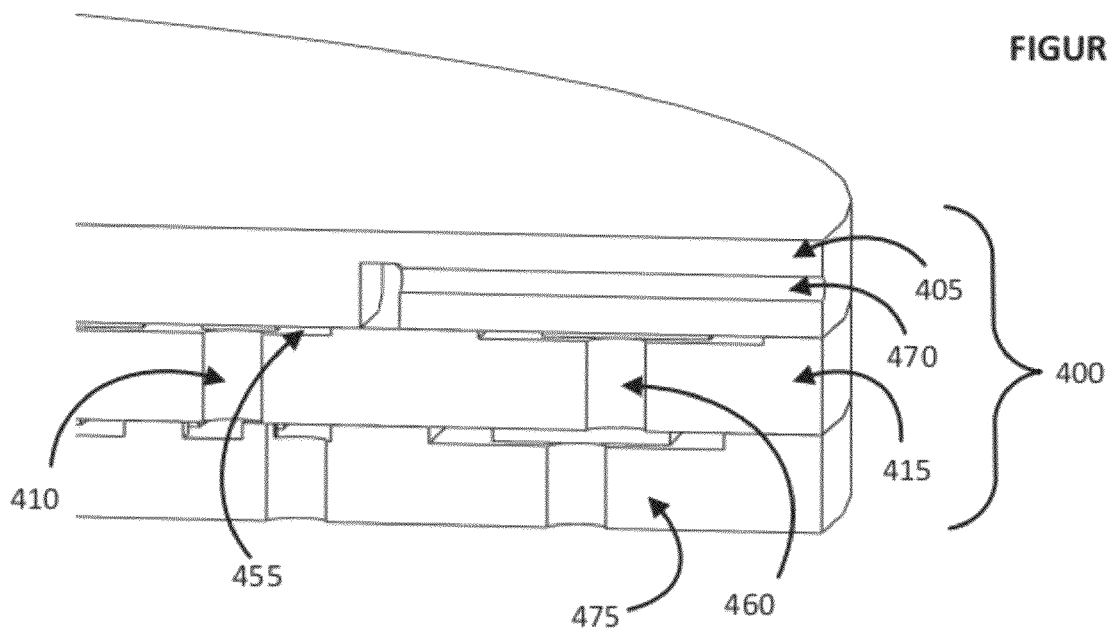
FIGS. 8A and 8B are perspective cross sectional and perspective top view diagrams of an exemplary susceptor assembly of this invention.
Figure 8B:
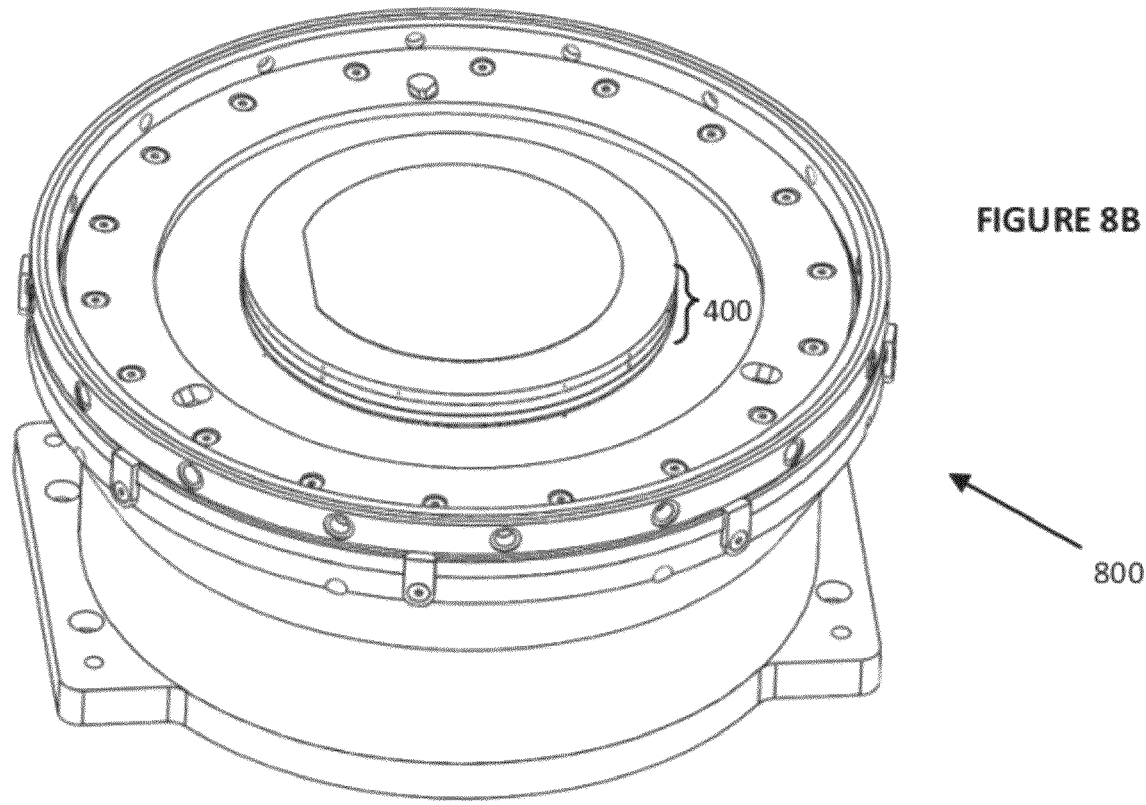

Referring now to FIGS. 8A and 8B, the susceptor assembly as previously described in FIGS. 4A and 4B may comprise one or more susceptor plates. The susceptor assembly 400 may be set in the lower part of a susceptor chamber 800 shown in FIG. 8B and be configured to support appropriate conditions for exfoliating, annealing or separating a free standing lamina. In FIG. 8A, a first plate 405 may be used for contacting a first surface of the donor body and provide separable support for the lamina during exfoliation, separation, annealing or any combination thereof. The first susceptor plate 405 may be used throughout the lamina production process, or separate plates with separate properties optimized for particular steps may be used. For example, the donor body may be contacted with a first susceptor plate assembly during implantation, a second susceptor plate during exfoliation and a third susceptor plate during separation. An optional upper surface (e.g., a chuck, not shown) may be utilized for contact with a second surface of the donor body opposite the first surface. The susceptor assembly 400 provides physical support for the thin lamina after exfoliation and also may provide thermal characteristics conducive to the exfoliation and annealing protocols utilized. In some embodiments the first susceptor plate 405 may be an inert solid such as graphite. In some embodiments of the present invention, the donor body or lamina is separably contacted to a susceptor assembly that is vacuum permeable. A porous material may be utilized for the first susceptor plate 405 to enable vacuum pressure to hold the donor body or the lamina to the susceptor during exfoliation. Porous materials may comprise porous graphite, porous boron nitride, porous silicon, porous silicon carbide, laser-drilled silicon, laser-drilled silicon carbide, aluminum oxide, aluminum nitride, silicon nitride or any combination thereof.

The vacuum may be achieved by applying negative gauge pressure in the surrounding environment (e.g., air or nitrogen) or by directed vacuum pressure via a series of vacuum channels 410. Selection of a porous susceptor plate material that is conducive to the process flow is important to the exfoliation process. Material properties that are conducive to the exfoliation process include: a low coefficient of static friction (CSF with values, e.g., 0.1-0.5), low hardness (<10 on Mohs Scale of Hardness), average pore diameter less than approximately 15 micrometers, ability to machine flatten (that is, able to use conventional machinery techniques/materials on these susceptors), low roughness (<1 µm roughness), flatness (<10 µm waviness over body), sufficient electrical conductivity to prevent the occurrence of static charges between the lamina and the susceptor, etc. In one embodiment the first susceptor plate 405 may have a coefficient of thermal expansion (CTE) that is substantially the same as the CTE of the donor body. In other embodiments the susceptor plate may have a heat capacity that is the same or lower than the heat capacity of the donor body. In some embodiments the donor body is monocrystalline silicon and the heat capacity of the susceptor is about the same as that of the silicon (about 19.8 J/mol-° K).

With these constraints, many engineering ceramics and other materials may be selected to provide these characteristics for the first susceptor plate 405. In one embodiment, Ringsdorff™ graphite grade R6340 may be used because it has a CTE similar to that of silicon. This is important in order to prevent lateral forces from being applied to the donor body or lamina during thermal treatments associated with exfoliation or annealing. With graphite whose CTE is not similar to that of silicon, these temperature changes may result in wrinkling or tearing of the lamina. With the CTE-matched graphite, the lamina may remain under light retention vacuum or no vacuum retention during these temperature changes. A bulk etch may be applied to the graphite to improve purity. A common bulk etch process consists of a 24 hour high temperature bake-out in a vacuum chamber that has been introduces with chloride gas.

In other embodiments of the exfoliation process, a rapid, high temperature thermal profile is applied. In these embodiments a susceptor plate that is resistant to off-gassing or degrading at temperatures as high as 800 or 900 or 1000° C. is desired. The susceptor material may have characteristics to prevent contamination of the donor body, such as being able to withstand the temperatures and atmospheric exposures of the processes without undergoing material degradation. The material may be intrinsically resistant to degradation or coated with a material that acts as a barrier to donor body contamination at elevated temperatures. For example porous silicon carbide—which is hard, durable, and has good CTE matching—may be coated with Boron Nitride, which is soft and has low CSF and high purity. In other embodiments, optimizing porous/laser-drilled materials may be utilized. Laser-drilled materials allow for differentiating between the necessities of the bulk of the chuck (porosity, CTE, flatness/machinability) and the necessities of the surface material (low CSF, soft, high purity, etc.). For example, a material which provides an interface with the desired properties listed above can be coated on a stock material having properties which are desirable for the base bulk. In other embodiments, metal oxides, carbides, nitrides, ceramics, and high temperature alloys which meet the previously mentioned specifications are candidates for use. The characteristics of the susceptor material described above beneficially improve the quality of the lamina produced, including the mechanical properties, uniformity, and purity of the lamina.

Figure 9A:
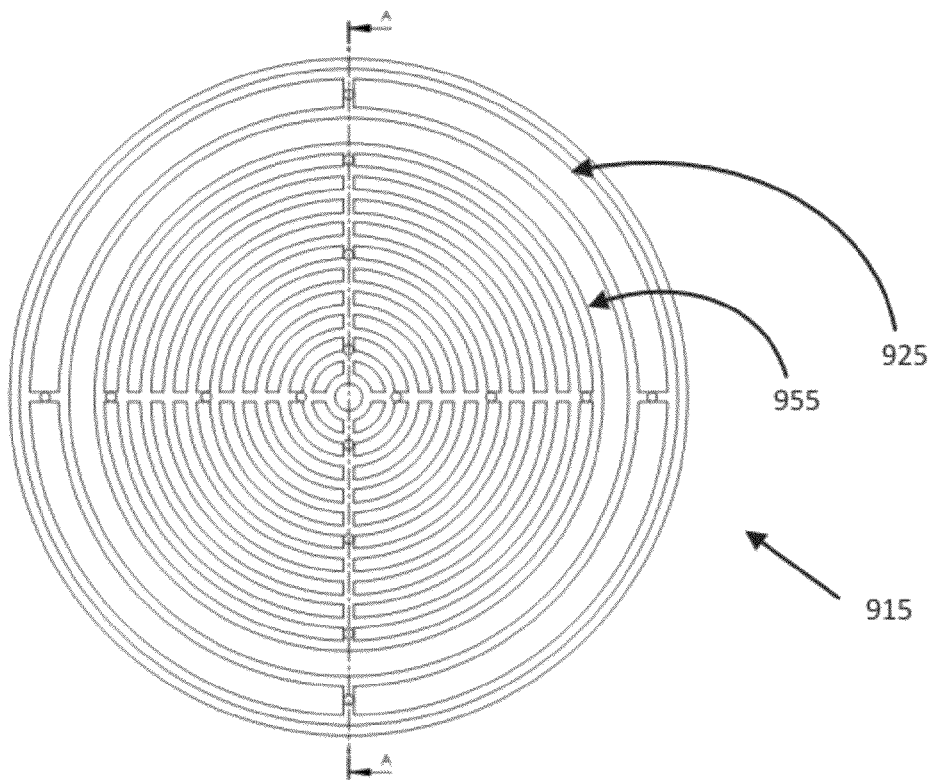
FIGS. 9A and 9B are top views showing embodiments of susceptor plates of this invention.

In another embodiment of the present invention, a uniform temperature profile may be applied to the donor body during exfoliation. In FIG. 8A, a second susceptor plate 415 that is thermally anisotropic may be disposed adjacent to the first plate 405 to provide a thermal conductivity that is preferentially higher in a plane parallel to the donor body compared to in a direction normal to the donor body in order to facilitate the application of a uniform thermal profile. The uniformity of the exfoliation temperature profile may be increased by the presence of pyrolytic carbon—a graphite material which is highly conductive across the cleave plane compared to perpendicular to the cleave plane, thus being an ideal planar thermal conductor. The thermally anisotropic second plate may comprise vacuum channels 410 in order to facilitate the distribution of vacuum pressure to the bottom side of the first susceptor plate 405. Extra features may include vacuum channels 455 that are machined into surface of the susceptor plate to improve the distribution of the vacuum pressure. In the embodiment shown in FIG. 9A a second susceptor plate 915 with a set of vacuum channels 955 that are shown as concentric rings connected by radial paths may be used to distribute vacuum pressure to a separate porous susceptor plate. Vacuum channels on the periphery 925 of the second susceptor plate 915 may be used to distribute vacuum pressure around the periphery of the susceptor plate in order to fix one susceptor plate to another device or plate.

In some embodiments, a heating source for the susceptor apparatus may be provided, such as by embedding heat lamps within a susceptor chamber. The heating source may be any source capable of providing the temperatures required for implantation, exfoliation or anneal, such as up to 1000° C. In other embodiments, the heating source may be placed separate from the susceptor chamber, such as, but not limited to, a quartz heating or induction heating element disposed within the susceptor chamber to heat the susceptor assembly and/or donor body.

In a further embodiment, differential vacuum channels may be used on the susceptor plates such that the vacuum to fix the plates 405 and 415 together is separate from the vacuum to hold the donor body to the susceptor assembly 400. FIG. 8A illustrates an exemplary susceptor assembly with differential vacuum channels. In order to vary the holding force, the vacuum pulling through the susceptor may need to be throttled. To decouple the effects of pulling through the porous material (e.g., graphite) onto the lamina versus pulling on the first susceptor plate itself, differential vacuum channels for the two may be employed. The first set of channels 410 is centrally located, and these control the suction on the lamina itself. The second set of vacuum channels 460 and an annulus 470 is located around the edge of the first and second susceptors—which holds the first susceptor in place, regardless of the chucking on the donor body in the center. By employing this system it is possible to remove the lamina while still keeping the susceptor assembly together.

Figure 9B:
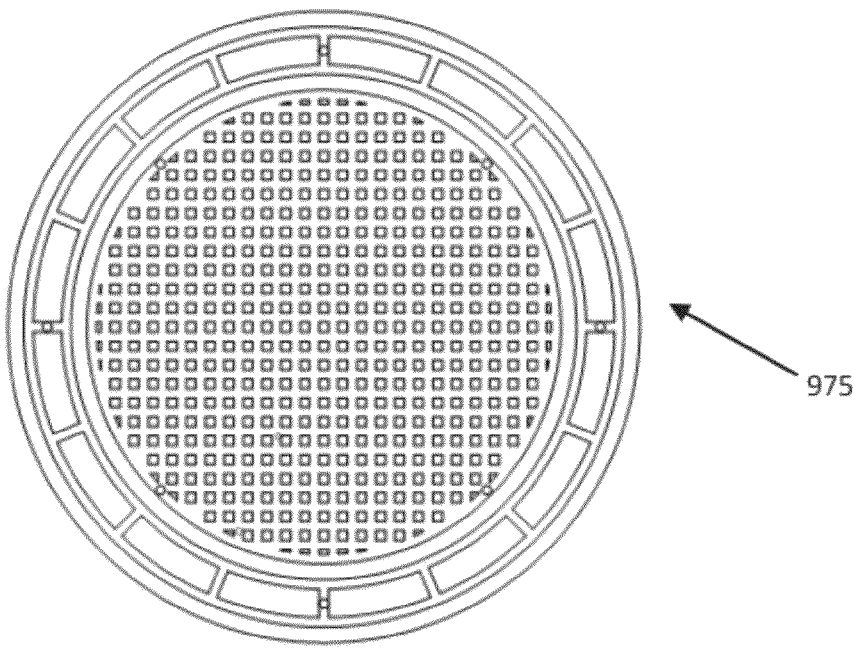

In some embodiments a vacuum force is applied to fix the lamina to the susceptor assembly during an annealing or exfoliation process which may contribute to a cooling of the susceptor assembly. In order to achieve the high temperatures needed for the annealing process or exfoliation process, the susceptor assembly may comprise a plate that provides a thermal break between the donor body and a lower vacuum manifold. A third susceptor plate 475 that acts as a thermal break may be added to the susceptor assembly 400 of FIG. 8A between a vacuum manifold (not shown) and either the first 405 or second 415 susceptor plate. In an alternative embodiment the first or second susceptor plate may act as a thermal break between the vacuum manifold and the lamina. In some embodiments of the present invention, the thermal break in anneal and/or exfoliation may be achieved by quartz discs, such as the disc 975, shown in FIG. 9B. The number of discs may be, for example, one or two depending on the temperature range and uniformity desired. Instead of quartz, other thermally insulative materials capable of withstanding annealing temperatures may be used, such as a high temperature ceramic. The quartz discs are machined to enable vacuum to pass through them, while still segregating the inner and outer annuli of the differential vacuum channels. This thermal break disc may be critical when using a vacuum manifold below the susceptor assembly that is water-cooled. The thermal break may prevent heat loss from the first susceptor plate 405, which may potentially facilitate achieving the temperatures needed to reach anneal and/or exfoliation. Properties of the thermal break susceptor plate 475 that may facilitate the annealing process include: low content of highly diffusive foreign materials (less than 20 PPM impurities), coefficient of thermal expansion similar to silicon (e.g., within 20% of silicon CTE), and high temperature compatibility (e.g., 1,000° C.), and low electrical resistivity.

Note that while the susceptor assembly with differential channels depicted in FIG. 8A is shown in conjunction with the thermal stack, the differential channel 460/470 and thermal stack 475 features may be used independently of each other. Similarly, the thermal stack may be utilized in any situation in which the top surface supporting the lamina operates at a different temperature than components beneath the thermal break element. Furthermore, the individual elements of the thermal stack (quartz as a thermal break separating the top surface from the lower surface—at a different temperature) may be used individually, in a different order, or in a different configuration.

Separation Apparatus

Figure 10A:
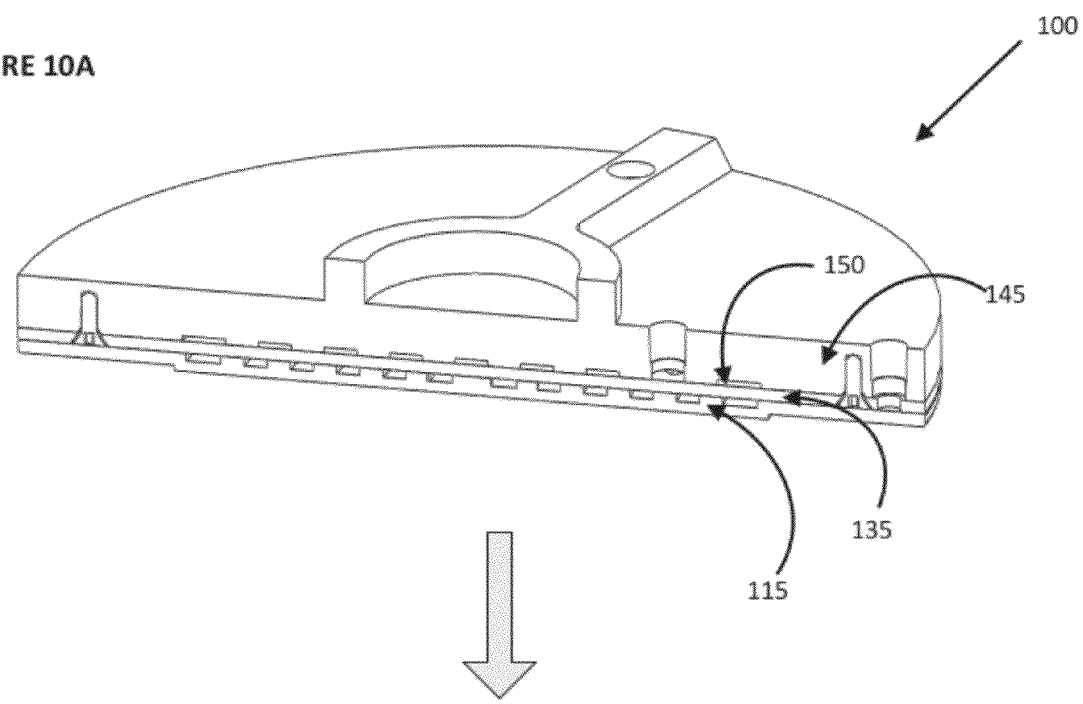
FIGS. 10A and 10B are perspective cross-sectional views showing a separation chuck of an embodiment of the present invention.
Figure 10B:
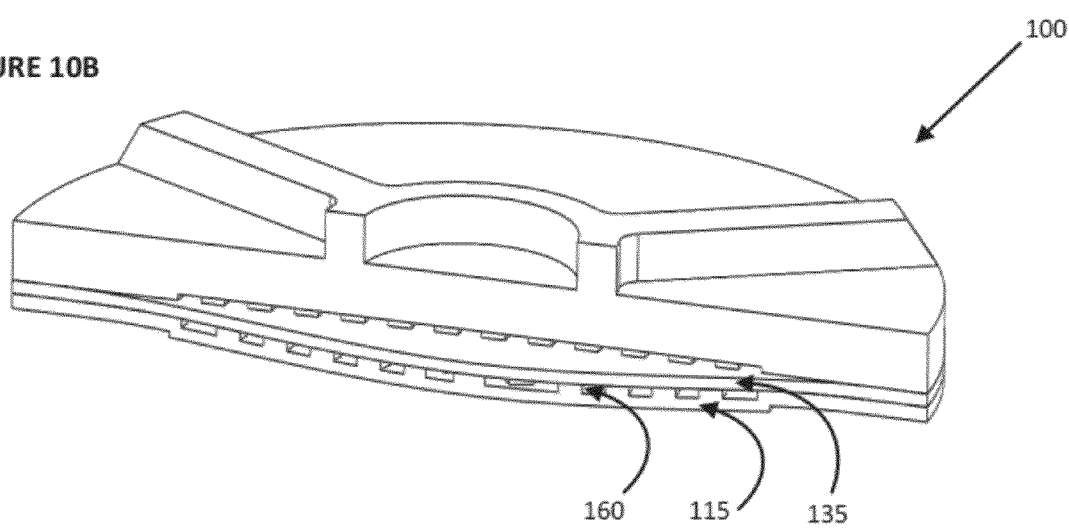

In FIGS. 10A and 10B, an embodiment of a separation chuck 100 for separating the donor body from the lamina in the method of FIG. 5B is shown. In operation, the surface of the donor body opposite the lamina would be placed against the separation chuck, and the exfoliated (but not yet separated) lamina body would be placed on a susceptor assembly. Alternatively the donor body/lamina may be inverted in this apparatus. The separation chuck 100 of FIGS. 10A and B involves a stack of plates including a porous plate 115 (for example, graphite), a flexing device such as a flexible plate 135 (for example, aluminum or PEEK), and a stiff support plate 145 (such as aluminum). The porous plate 115 shall be referred to as graphite in this disclosure; however, other materials are also possible as shall be described later. The stiff plate 145 has distribution channels 150 in it to apply positive pressure to the backside of the flexible plate 135. The distribution channels may be configured, for example, as concentric rings connected by radial channels, or as a linear grid. The flexible plate 135 may be secured to the stiff plate 145 around its circumference. When a positive pressure is applied, the central portion of the flexible plate 135 will deflect into a convex shape, such as in FIG. 10B, forcing the porous plate 115 to follow that shape. The flexible plate may deflect by, for example, on the order of 1 or 2 or more millimeters. The operating pressure of the device may be any pressure, for example, 0.1-5 bar. This pressure depends on the thickness of the materials in the device. Three requirements of the flexible plate are mechanical strength to take pressure applied to it, compliance to elastically bend (as opposed to breaking) and being impermeable to pressurized air. In one embodiment, the porous layer 115 is approximately 3 mm in thickness, and the impermeable flexible plate 135 is approximately 5 mm thick. Other material choices for the flexible layer 135 include pliable metals like aluminum, thin gauge steel, or polymer, elastomeric or rubber-based materials. In some embodiments the donor body (not shown) may be held against the porous plate 115 by applying a vacuum between the flexible plate and porous plate. Since the graphite plate is porous, vacuum may be applied to distribution channels 160 behind the plate 115, via a vacuum inlet to the vacuum volume, to provide an even suction through the porous plate 115.

EXAMPLES

Lamina Formation from a {111} Monocrystalline Donor Wafer

The process begins with donor wafer with Miller indices of {111}. A first surface is provided that is substantially planar, but may have some preexisting texture. The donor body was implanted with a total ion dosage of $4.0 \times 10^{16}$ H atoms/cm$^3$ at 400 keV. The implant temperature was approximately ° C. The implantation resulted in a cleave plane 4.5 μm from a first surface of the donor body. The donor body was doped with an n-type dopant such as boron to a resistivity between 1 and 3 ohm-cm.

After implantation the implanted surface of the donor wafer was contacted with a susceptor assembly. The susceptor assembly comprised a susceptor plate of porous graphite. Additionally, the porous graphite had been machine smoothed with 1500 grit sandpaper to provide a uniformly flat and smooth surface. No vacuum pressure was applied to the wafer. Once contacted to the susceptor assembly, a thermal exfoliation profile was applied that comprised two thermal ramps. Beginning at room temperature the following ramp sequence was applied: 15° C./s ramp to 400° C., hold at 400° C. for 60 seconds, followed by a 10° C./s ramp to 700° C. At this point the lamina had exfoliated from the donor wafer and was annealed by ramping to 950° C. at 10° C./s and holding for 1 minute. The wafer was then allowed to cool down to room temperature.

The donor body was separated from the lamina at room temperature while the first surface of the lamina (formerly the donor body) remained fixed to the susceptor plate. A vacuum force of −13 psi was applied to a porous plate in a susceptor assembly, fixing the lamina to the susceptor assembly. A portion of the second surface of the donor body opposite the first surface was contacted to a porous plate of a separation chuck coupled to a vacuum line. The porous plate of the separation chuck was coupled to a rigid arm comprising a pivot point. When a vacuum was applied to the porous plate of the separation chuck, a portion of the plate compacted against the donor body causing the rigid arm to pivot on the pivot point, lifting a portion of the donor body away from the lamina. After the initial separation from the lamina, the donor body was lifted manually from the lamina and returned to the process line. The lamina was further processed to form a photovoltaic device. The separation process occurred at ambient temperature and pressure.

Lamina from a {100} Monocrystalline Donor Wafer

The process begins with donor wafer with Miller indices of {100}. A first surface is provided that is substantially planar, but may have some preexisting texture. The donor body was implanted with a total ion dosage of $8.0 \times 10^{16}$ H atoms/cm$^3$ at 400 keV. The implant temperature was approximately 160° C. The implantation resulted in a cleave plane 4.5 μm from a first surface of the donor body.

After implantation, the implanted surface of the donor wafer was contacted with a susceptor assembly. The susceptor assembly comprised a susceptor plate of porous graphite. The porous graphite had been machine smoothed with 1500 grit sandpaper to provide a uniformly flat smooth surface. The susceptor assembly further comprised a second susceptor plate that was thermally anisotropic. The second susceptor plate comprised pyrolytic graphite and provided a thermally anisotropic material to facilitate a uniform thermal treatment. The donor body was fixed to the susceptor assembly by the application of −13 psi vacuum to the first susceptor plate.

After contacting the susceptor assembly to the donor body, a thermal exfoliation profile was applied that comprised a thermal ramp rate of 2.3° C./s to a first exfoliation temperature of 440° C. which was held for 60 seconds, followed by a thermal ramp rate of 0.2° C./s to 490° C., which was held for 500 seconds. After exfoliation, a thin free standing lamina comprising a first surface that was the first surface of the donor body and a second surface opposite the first surface was annealed at 950° C. for 3 minutes. The wafer was allowed to cool to room temperature.

The donor body was separated from the lamina at room temperature while the first surface of the lamina (formerly the donor body) remained fixed to the susceptor plate with an applied vacuum force of −13 psi. A portion of second surface of the donor body opposite the first surface of lamina was contacted to the porous plate of a separation chuck that was coupled to a vacuum line. The porous plate was also coupled to a rigid arm comprising a pivot point. When a vacuum was applied to the porous plate, a portion of the porous plate compacted against the donor body causing the rigid arm to pivot on the pivot point, lifting a portion of the donor body away from the lamina. The donor body was lifted manually from the donor body and returned to the process line. The lamina was further processed to form a photovoltaic device.

A variety of embodiments have been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention. The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of producing a lamina from a donor body, the method comprising the steps of:
   a. implanting a first surface of a donor body with an ion dosage to form a cleave plane;
   b. heating the donor body to an implant temperature during implanting;
   c. separably contacting the first surface of the donor body to a first surface of a susceptor assembly, wherein the first surface of the donor body and the first surface of the susceptor assembly are in direct contact;
   d. applying an exfoliation temperature to the donor body to exfoliate a lamina from the donor body at the cleave plane, wherein the first surface of the donor body comprises a first surface of the lamina;
   e. separating the lamina from the donor body; and
   f. adjusting the combination of dosage, implant temperature, exfoliation temperature and exfoliation pressure to maximize an area substantially free of physical defects in the lamina.

2. The method of claim 1 wherein the susceptor assembly is positioned underneath the donor body, and wherein the separable contact of the first surface of the donor body to the first surface of the susceptor assembly solely comprises a force provided by the weight of the donor body.

3. The method of claim 1 wherein the separable contact of the first surface of the donor body to the first surface of the susceptor assembly comprises applying a vacuum force to the susceptor.

4. The method of claim 1 wherein the exfoliation temperature profile is substantially uniform across the first surface of the donor body.

5. The method of claim 1 wherein the exfoliation temperature profile comprises ramping to a peak temperature that is between 600 and 1000° C. at a rate of at least 1° C. per second.

6. The method of claim 1 wherein the step of applying an exfoliation temperature comprises moving the donor body from a zone of a first temperature into a zone of a second temperature, wherein the second temperature is higher than the first temperature.

7. The method of claim 1 wherein the physical defects are selected from the group consisting of wavefront defects, radial striations, flaking, tears, holes or any combination thereof.

8. The method of claim 1 wherein the implant temperature is between 80 and 250° C.

9. The method of claim 1 wherein the thickness of the lamina is between about 1 and 20 microns.

10. The method of claim 1 wherein greater than 90% of the surface area of the first surface of the lamina is free of the physical defects, and wherein the surface area of the lamina is substantially equal to the surface area of the first surface of the donor body.

11. The method of claim 1 wherein the exfoliation occurs at ambient pressure.

12. The method of claim 1 further comprising the step of reusing the susceptor after separating the lamina from the donor body.

13. The method of claim 1 wherein the first surface of the susceptor assembly comprises a first plate capable of contacting with the donor body, wherein the first plate comprises a porous material through which vacuum pressure can permeate.

14. The method of claim 1 wherein separating the lamina from the donor body comprises applying a force to a portion of a second surface of the donor body, wherein the second surface is opposite the first surface of the lamina, and wherein the donor body is deformed away from the lamina.

15. The method of claim 1 wherein separating the lamina from the donor body comprises applying a force to a portion of the first surface of the lamina, and wherein the lamina is deformed away from the donor body.

16. The method of claim 1 further comprising the steps of:
a. separating the lamina from the susceptor assembly; and
b. fabricating a photovoltaic cell, wherein the photovoltaic cell has a first amorphous silicon layer in immediate contact with the first surface of the lamina and a second amorphous silicon layer in immediate contact with a second surface of the lamina.

17. The method of claim 13 wherein the first plate comprises porous graphite, porous boron nitride, porous silicon, porous silicon carbide, laser-drilled silicon, laser-drilled silicon carbide, aluminum oxide, aluminum nitride, or silicon nitride or any combination thereof.

18. The method of claim 13 wherein the first plate has a first coefficient of thermal expansion and the donor body has a second coefficient of thermal expansion, and wherein the first and second coefficients of thermal expansion are substantially the same.

19. The method of claim 13 wherein the susceptor assembly further comprises a second plate adjacent to the first plate, and wherein the second plate is thermally anisotropic.

20. The method of claim 13 wherein the first plate comprises a material that has a heat capacity that is lower than the heat capacity of the donor body.

21. The method of claim 16 wherein the susceptor assembly is positioned underneath the donor body, and wherein the separable contact of the first surface of the donor body to the first surface of the susceptor assembly solely comprises a force provided by the weight of the donor body.

22. The method of claim 16 wherein the separable contact of the first surface of the donor body to the first surface of the susceptor assembly comprises applying a vacuum force to the susceptor.

23. The method of claim 16 wherein the exfoliation temperature profile is substantially uniform across the first surface of the donor body.

24. The method of claim 16 wherein the exfoliation temperature profile comprises ramping to a peak temperature that is between 600 and 1000° C. at a rate of at least 1° C. per second.

25. The method of claim 16 wherein the step of applying an exfoliation temperature comprises moving the donor body from a zone of a first temperature into a zone of a second temperature, wherein the second temperature is higher than the first temperature.

26. The method of claim 19 wherein the second plate comprises pyrolytic graphite.

* * * * *

UNITED STATES PATENT AND TRADEMARK OFFICE
CERTIFICATE OF CORRECTION

PATENT NO.        : 8,268,645 B2
APPLICATION NO.   : 13/331909
DATED             : December 20, 2011
INVENTOR(S)       : Adam Kell et al.

Page 1 of 1

It is certified that error appears in the above-identified patent and that said Letters Patent is hereby corrected as shown below:

In column 18, line 62, after 1000°, please delete "C." and insert --C--.

In column 18, line 62, after 1°, please delete "C." and insert --C--.

In column 20, line 31, after 1000°, please delete "C." and insert --C--.

In column 20, line 31, after 1°, please delete "C." and insert --C--.

Signed and Sealed this
Sixth Day of November, 2012

David J. Kappos
*Director of the United States Patent and Trademark Office*